United States Patent
Kernebeck

(10) Patent No.: US 9,841,295 B2
(45) Date of Patent: Dec. 12, 2017

(54) MAGNETIC FIELD SENSOR APPARATUS, OPERATING APPARATUS AND METHOD FOR DETERMINING A RELATIVE POSITION

(71) Applicant: ZF FRIEDRICHSHAFEN AG, Friedrichshafen (DE)

(72) Inventor: Bernd Kernebeck, Bad Essen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 81 days.

(21) Appl. No.: 14/783,195

(22) PCT Filed: Mar. 12, 2014

(86) PCT No.: PCT/EP2014/054779
§ 371 (c)(1),
(2) Date: Oct. 8, 2015

(87) PCT Pub. No.: WO2014/166689
PCT Pub. Date: Oct. 16, 2014

(65) Prior Publication Data
US 2016/0069709 A1    Mar. 10, 2016

(30) Foreign Application Priority Data

Apr. 12, 2013    (DE) ........................ 10 2013 206 518

(51) Int. Cl.
*G01B 7/14*    (2006.01)
*G01B 7/30*    (2006.01)
(Continued)

(52) U.S. Cl.
CPC ............. *G01D 5/142* (2013.01); *G01D 5/145* (2013.01); *G01D 5/20* (2013.01); *H03K 17/97* (2013.01)

(58) Field of Classification Search
CPC .......... G01D 5/142; G01D 5/20; G01D 5/145; H03K 17/97
(Continued)

(56) References Cited

U.S. PATENT DOCUMENTS

| 4,660,430 A | 4/1987 | Bortfeld |
|---|---|---|
| 5,969,519 A | 10/1999 | Garneyer |

(Continued)

FOREIGN PATENT DOCUMENTS

| DE | 19603197 | 2/1997 |
|---|---|---|
| DE | 19959616 | 6/2001 |

(Continued)

*Primary Examiner* — Giovanni Astacio-Oquendo
(74) *Attorney, Agent, or Firm* — Cozen O'Connor

(57) ABSTRACT

A magnetic field sensor apparatus (101) has a generator device which comprises at least two parts and which has at least two magnets (106, 108) for generating at least two magnetic fields (332, 334) and a detection device for detecting the magnetic fields (332, 334). The magnets (106, 108) of the generator device are arranged so as to be movable relative to one another and with respect to the detection device. The detection device has at least two sensors (110, 112) for generating at least two sensor signals which depend on the magnetic fields (332, 334). The sensors (110, 112) are arranged adjacent to one another in a detection area in an intersection area of the magnetic fields (332, 334) of the at least two magnets (106, 108).

9 Claims, 2 Drawing Sheets

US 9,841,295 B2
Page 2

(51) Int. Cl.
*G01D 5/14* (2006.01)
*H03K 17/97* (2006.01)
*G01D 5/20* (2006.01)

(58) Field of Classification Search
USPC .............................. 324/207.22, 200, 207.11
See application file for complete search history.

(56) References Cited

U.S. PATENT DOCUMENTS

| | | | |
|---|---|---|---|
| 6,411,081 B1 | 6/2002 | Spellman | |
| 6,773,369 B2 | 8/2004 | Lohner | |
| 7,441,474 B2 | 10/2008 | Kliemannel | |
| 9,644,732 B2* | 5/2017 | Pfeifer | G01D 5/145 |
| 2006/0078369 A1* | 4/2006 | Spratte | B60G 7/005 |
| | | | 403/122 |
| 2007/0216402 A1 | 9/2007 | Blessing | |
| 2011/0316528 A1* | 12/2011 | Matsumoto | G03B 5/00 |
| | | | 324/207.14 |
| 2013/0000403 A1 | 1/2013 | Mai | |
| 2014/0009043 A1* | 1/2014 | Watanabe | G01B 7/30 |
| | | | 310/68 B |
| 2014/0139048 A1* | 5/2014 | Ruff | G08C 17/00 |
| | | | 307/143 |
| 2014/0184209 A1* | 7/2014 | Kouno | G01D 5/145 |
| | | | 324/207.25 |

FOREIGN PATENT DOCUMENTS

| | | |
|---|---|---|
| DE | 102006011207 | 9/2007 |
| DE | 102007052146 | 5/2009 |
| DE | 102009043178 | 3/2011 |
| DE | 102008037080 | 2/2012 |
| EP | 1238214 | 9/2002 |
| EP | 1777501 | 4/2007 |
| WO | WO2011082886 | 7/2011 |

* cited by examiner

MAGNETIC FIELD SENSOR APPARATUS, OPERATING APPARATUS AND METHOD FOR DETERMINING A RELATIVE POSITION

PRIORITY CLAIM

This is a U.S. national stage of application No. PCT/EP2014/054779, filed on Mar. 12, 2014. Priority is claimed on the following application: Country: Germany, Application No.: 10 2013 206 518.3, Filed: Apr. 12, 2013, the content of which is/are incorporated herein by reference in its entirety.

FIELD OF THE INVENTION

The present invention is directed to a magnetic field sensor apparatus, an actuation device for a vehicle and a method for determining a relative position between a first component and a second component which can be used, for example, in connection with selector buttons for selecting a gear in a vehicle.

BACKGROUND OF THE INVENTION

Magnetic field sensors can be used to detect a relative position between two components. For this purpose, a generator device by which a magnetic field is generated can be arranged at a first component and a sensor unit for evaluating the magnetic field can be arranged at a second component.

EP 1 777 501 A1 discloses a position sensor arrangement for noncontacting position determination by means of redundant magnet-sensitive sensor elements.

SUMMARY OF THE INVENTION

The present invention provides an improved magnetic field sensor apparatus, an improved actuation device for a vehicle, and an improved method for determining a relative position between a first component and a second component. Advantageous embodiments are disclosed in the following description.

The invention is directed to a magnetic field sensor apparatus with an at least two-part generator device having at least two magnets for generating at least two magnetic fields and a detection device for detecting the magnetic fields, characterized in that the magnets of the generator device are arranged so as to be movable relative to one another and with respect to the detection device, and the detection device has at least two sensors for generating at least two sensor signals which depend on the magnetic fields, the sensors being arranged adjacent to one another in a detection area at an intersection region of the magnetic fields of the at least two magnets.

Accordingly, the magnetic field sensor apparatus has the generator device and the detection device arranged so as to be separated from one another and so as to be movable relative to one another. The generator device can comprise a plurality of magnets or magnetic elements each in the form of a permanent magnet or an electromagnet. The magnets can be constructed as bar magnets. It is also contemplated to use an air-core coil or solenoid as a magnetic element. Each magnet (or magnetic element) can be configured to generate a magnetic field, so that each of the magnetic fields eminates from one of the magnets. Since the generator device is constructed so as to have at least two parts, the at least two magnets can be arranged so as to be movable relative to one another. Each subpart of the generator device can be configured to execute a relative movement with respect to the detection device independently from another subpart of the generator device.

The detection device can include a plurality of sensors or sensor elements, and the sensors can be conventional sensors for measuring magnetic flux density. By way of example, the sensors can be Hall sensors, MR (magnetoresistive) sensors or magnetic dependent resistors. Each of the sensors can be configured to generate a sensor signal that is dependent on at least two magnetic fields. The sensor signals can be electrical signals, as for example an electric voltage. In this regard, the sensor signal can represent a quantity constituting a proportion of the at least two magnetic fields which are detected by the sensor that generates the sensor signal. Therefore, a change in magnetic field caused by a change in position or relative movement between the magnets that are producing the magnetic field and the sensor which is generating the sensor signal will result in a change in the sensor signal effected by the change in the magnetic field. The detection area of each of the sensors can be arranged at an intersection region of at the least two magnetic fields that are generated by the two adjacent magnets.

An actuation device for a vehicle, constructed in accordance with the present invention, has the following features: a first component comprising at least two parts; a second component, the first component and the second component being arranged so as to be movable relative to one another; and a magnetic field sensor apparatus in accord with an embodiment thereof as herein described, wherein the generator device is arranged at the first component and the detection device is arranged at the second component.

The vehicle can be a motor vehicle, as for example a road motor vehicle such as a passenger car or truck. The actuation device can be a switch button device for selecting a gear of a motor vehicle transmission, such as an automatic transmission. The first component can have at least two selector buttons for selecting gears. For this purpose, a magnet of the generator device of the magnetic field sensor apparatus can in each instance be arranged at a respective selector button. The second component can be a receiving structure, or the like, for the selector buttons. A sensor of the detection device of the magnetic field sensor apparatus can be arranged in an area for receiving a selector button. When a selector button is pressed, a relative movement takes place between the generator device and the detection device. When no selector button is pressed, the magnets or the generator device are or is arranged in an initial position with respect to the detection device and, when a selector button is pressed, the magnet associated with the selector button is moved to an actuation position with respect to the detection device. The relative position between the components can be determined by evaluating the sensor signals of the magnetic field sensor apparatus.

A method for determining a relative position between a first component having at least two parts and a second component, which components are movable relative to one another, comprises the following steps: generating at least two magnetic fields with an at least two-part generator device which is arranged at the first component and includes at least two magnets for generating the magnetic fields; detecting the magnetic fields with a magnetic fields detection device which is arranged at the second component and which has at least two sensors for generating at least two sensor signals dependent on the magnetic fields, the magnets of the generator device being arranged so as to be movable relative to one another and with respect to the detection device, and the sensors being arranged adjacent to one another in a detection area at an intersection region of the magnetic fields of the at least two magnets; and combining the sensor signals of the detection device to determine the relative position between the first component and the second component.

When utilized in conjunction with a form of the actuation device as herein disclosed, the inventive method can be advantageously configured to determine the relative position between the components.

In accordance with preferred embodiments of the present invention, in a magnetic field sensor apparatus which can be used for position detection, a magnetic field is generated by a generator device and is detected by a detection device, with the generator device arranged so as to be movable relative to the detection device. Relative movement by or between the generator device and the detection device results in a change in the magnetic fields detected by the detection device. The relative position between the generator device and the detection device can be inferred from the size or strength of the magnetic fields as detected by the detection device. The magnetic field sensor apparatus can be influenced by a magnetic disturbance field. The detection device can have at least two sensors so that the influence of a disturbance field of this type on a subsequent signal evaluation can be recognized or eliminated. The sensors can be constructed and arranged in such a way that they are influenced identically by the disturbance field. When sensor signals of the sensors are combined with one another in a suitable manner, a component of the disturbance field that is contained in the sensor signals can be determined or eliminated; this makes it possible to use the magnetic field sensor apparatus in applications in which a variable disturbance field of this kind must be accommodated or taken into account.

In particular, according to preferred embodiments of the present invention, the elimination of disturbance signals can be effected in analog Hall sensor systems with a plurality of generator units or a generator device comprising a plurality of parts. For example, it can be possible to eliminate disturbance signals in a switch button arrangement having at least two adjacent selector buttons for selecting a gear in a motor vehicle transmission, the selector buttons being arranged so as to be movable relative to one another. The elimination of disturbance signals is implemented via the arrangement of the magnet element associated with each selector button, of the magnetic field-sensitive sensor elements and of different pole orientations of the magnet elements that are arranged adjacent to one another.

Accordingly, by means of the magnetic field sensor apparatus, position detection can advantageously be achieved by analog sensors which are not susceptible to external disturbance fields. Since the sensor arrangement is configured in at least a twofold manner, an external magnetic disturbance field can be prevented from corrupting the position detection of the sensor arrangement, particularly permanently or electrically. Accordingly, misdiagnoses and erroneous detections can be reliably prevented. Position detection and a plausibility check of the detected relative positions can be achieved by means of the sensors and, in addition, a disturbance field acting on the magnetic field sensor apparatus can be detected. Through the arrangement of magnets, a detection of disturbance signals can be realized via at least two of the sensors. Furthermore, extra costs or expensive modifications in implementing the inventive apparatus and method can be avoided because existing component parts are utilized. It is advantageous for the plausibility check of a detected relative position that a button movement affecting the relative position acts on the sensor provided for the actuated button and also, with diminished intensity and opposite pole, on the adjacent sensor. Accordingly, actuation of a particular one of the buttons is determined by means of at least two sensors. This reduces susceptibility to disturbance and improves availability without incurring extra costs.

In order to detect relative positions of a quantity "n" of buttons, "n" buttons, "n" magnets, and "n" sensors can be provided, and, for every button, a magnet and a sensor represent one unit for position detection.

In accordance with an embodiment of the magnetic field sensor apparatus, the magnetic field sensor can have an evaluating device which is configured to combine the sensor signals of the detection device with one another to determine a magnetic disturbance quantity superimposed on the magnetic fields and, additionally or alternatively, a parameter of the magnetic fields and, additionally or alternatively, a relative position between the at least two-part generator device and the detection device. The evaluating device can be an electric circuit which is configured to receive the sensor signals, to evaluate them and to prepare an evaluation signal such that the magnetic disturbance quantity represents the parameter of the magnetic fields or of the relative position. For combining the sensor signals or values represented by the sensor signals, the evaluating device can be configured to add or subtract or to take an average of the sensor signals. Dimensions of the detection area in which the at least two sensors are arranged can be selected such that an anticipated magnetic disturbance field for an application of the magnetic field sensor apparatus is homogeneous or approximately homogeneous within the detection area so that the sensors are influenced by approximately the identical magnetic disturbance field. Therefore, a magnetic disturbance field which is approximately identical with respect to intensity and direction can act on the sensors at the same time. In this regard, the wording "approximately identical" can mean identical, as for example within the measurement tolerances of the magnetic field sensor apparatus. Thus, the evaluating device can be configured by way of illustration to determine a quantity and, additionally or alternatively, a direction of the magnetic disturbance quantity within the detection area. Further, the evaluating device can be configured to determine a quantity and, additionally or alternatively, a direction of the magnetic fields within the detection area. When determining the quantity and, additionally or alternatively, a direction of the magnetic fields, the influence of a magnetic disturbance quantity can be taken into account and eliminated or reduced. Furthermore, the evaluating device can be configured to determine the relative position between the generator device and the detection device by using reference values and the quantity and, additionally or alternatively, the direction of the magnetic fields. Through the combination of sensor signals, the influence of a magnetic disturbance field on the sensor function can be determined and, additionally or alternatively, reduced or eliminated.

In particular, the generator device can have a first subpart with a first magnet for generating a first magnetic field and a second subpart with a second magnet for generating a second magnetic field. In this regard, the first subpart and the second subpart of the generator device can be arranged so as to be movable relative to one another. The first magnet can be constructed so as to be identical to the second magnet. The first magnet and the second magnet can be constructed as bar magnets. The longitudinal axis of a magnet can be defined in each instance by an axis between the magnetic north pole and the magnetic south pole of the magnet. The first longitudinal axis of the first magnet can be oriented parallel to the second longitudinal axis of the second magnet. The first longitudinal axis can be directed through the first sensor in all possible relative positions between the generator device and detection device. The second longitudinal axis can be directed through the second sensor in all possible relative positions between the generator device and detection device. The first longitudinal axis and second longitudinal axis can be arranged in each instance parallel to one another in the possible relative positions. In accordance with this embodiment, the generator device can be implemented using two magnets. The first magnetic field can extend between the magnetic north pole and the magnetic south pole of the first magnet. The second magnetic field can extend between the magnetic north pole and the magnetic south pole of the second magnet.

In this embodiment, the first magnet and the second magnet can be arranged with opposite pole orientation relative to one another. The first magnet and the second magnet can also be oriented in opposite directions relative to one another. In other words, adjacently arranged magnets can have a different pole orientation relative to one another with respect to the detection device. For example, the magnetic north pole of the first magnet can be arranged facing or opposing a first sensor, and the magnetic south pole of the second magnet can be arranged facing or opposing a second sensor. Since the first magnetic field and the second magnetic field can be oriented in opposite directions with respect to one another, a potential magnetic disturbance quantity can lead to an intensification of the detected magnetic field in one of the sensors and to a diminution of the detected magnetic field in the other sensor. As such, a detection and plausibility check of a relative position of the generator device with respect to the detection device can be carried out more reliably and economically.

In another embodiment, the detection device can have a first sensor and a second sensor, with the first sensor configured to generate a first sensor signal depending on the first magnetic field and the second magnetic field, and the second sensor configured to generate a second sensor signal depending on the first magnetic field and the second magnetic field. In this manner, a sensing direction of the first sensor can correspond to a sensing direction of the second sensor. The first sensor and second sensor can be identically constructed. The first sensor and second sensor can be correspondingly oriented, wired or electrically contacted with respect to one another. In this embodiment, a sensing direction or sensing characteristic of the first sensor can correspond to a sensing direction or sensing characteristic of the second sensor, which means that an imaginary magnetic field of any type produces the same sensor signal when acting on the first sensor as when acting on the second sensor. Base surfaces or contacting surfaces of the sensors, for example, can be identically oriented. The first sensor can be arranged opposite to or in a main area of influence of the magnetic north pole of the first magnet. The second sensor can be arranged opposite to or in a main area of influence of a magnetic south pole of the second magnet. In accordance with such an embodiment, two magnetic fields are generated, wherein the first magnetic field is detected by the first sensor and the second sensor and the second magnetic field is detected by the second sensor and the first sensor. For each magnetic field, two sensors, or more than two sensors in other embodiments, can be provided for detection. Therefore, the detection and plausibility check of the magnetic field parameters or relative position of the generator device with respect to the detection device can be carried out more accurately and reliably.

During operation of the magnetic field sensor apparatus, a magnetic field line of the first magnetic field and a magnetic field line of the second magnetic field can penetrate the first sensor and the second sensor. The magnetic field line of a selected magnetic field can penetrate the first sensor at a first angle with respect to a sensing plane of the first sensor, and the magnetic field line of the selected magnetic field can penetrate the second sensor at a second angle different from the first angle with respect to a sensing plane of the second sensor. By virtue of this twofold detection, the magnetic field detection and plausibility check of the measured value can be less susceptible to disturbances and more accurate.

In accordance with an embodiment of the invention, the magnetic fields can be identical in magnitude, particularly in the detection area. Magnetic fields of identical size or magnitude can be realized by employing identical magnets. When the first magnetic field is oriented opposite the second magnetic field, the first sensor signal and the second sensor signal, or values represented by the first sensor signal and second sensor signal, can have the same magnitude but different mathematical signs in the absence of a magnetic disturbance field Because the magnetic fields are of identical size with respect to magnitude, a magnetic disturbance field can be identified or determined in a particularly simple manner from the sensor signals.

The sensors can also be arranged adjacent to one another in a sensing plane and, additionally or alternatively, on a common support substrate. The sensing plane may be formed, for example, by a surface of a printed circuit board or a surface of another support substrate. The support substrate or printed circuit board can have electrically-conductive lines for effecting electrical contact with the sensors. Of course, the sensors can be arranged either on a common support substrate or on separate support substrates. Moreover, the sensors can be arranged in a common sensing plane or in sensing planes diagonal to one another, where the wording "sensing plane" means a plane or surface that is penetrated by a magnetic field that is to be detected or sensed by a sensor.

The sensors can have additional sensing planes that can be oriented orthogonal to the aforementioned sensing plane. A two-dimensional sensor can have two sensing planes and a three-dimensional sensor can have three sensing planes that are oriented orthogonal, in each case, to one another. Thus, the sensors can be constructed as one-dimensional sensors, two-dimensional sensors or three-dimensional sensors.

The invention will now be described more fully by way of example with reference to the accompanying drawings.

BRIEF DESCRIPTION OF THE DRAWINGS

In the drawings, wherein identical or similar reference numerals identify elements having the same or similar functionality throughout the several Figures.

DETAILED DESCRIPTION OF THE PREFERRED EMBODIMENTS

Figure 1:
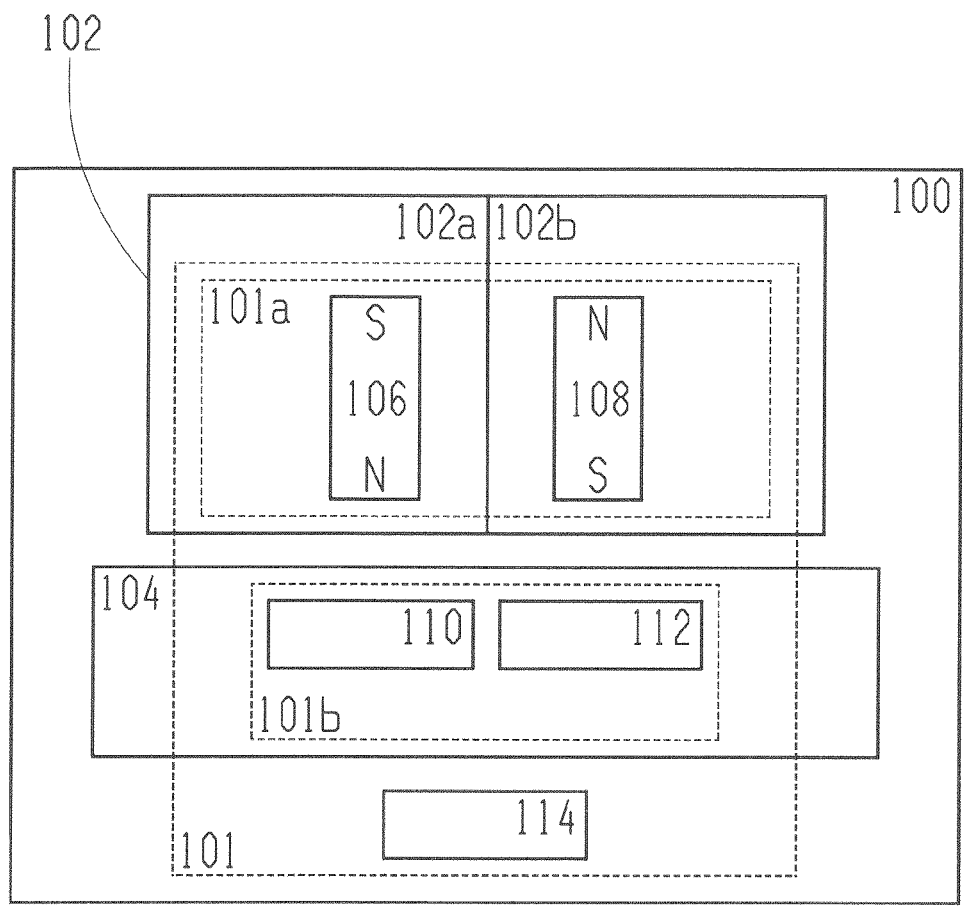
FIG. 1 is a schematic depiction of an actuation device constructed in accordance with an embodiment of the present invention.

FIG. 1 shows a schematic depiction of an actuation device 100 for a vehicle in accordance with an embodiment of the present invention. Depicted in the drawing are the actuation device 100, a magnetic field sensor apparatus 101, a generator device 101a, a detection device 101b, a first component 102, a first subpart 102a, a second subpart 102b, a second component 104, a first magnet 106, a second magnet 108, a first sensor 110, a second sensor 112, and a evaluating device 114. The actuation device 100, in this illustrative embodiment, is a device for selecting a gear of a transmission of a vehicle.

The actuation device 100 includes the magnetic field sensor apparatus 101, the first component 102 and the second component 104. The first component 102 has a first subpart 102a and a second subpart 102b. The first subpart 102a and the second subpart 102b are movable relative to one another. In the embodiment shown in FIG. 1, the first subpart 102a and the second subpart 102b of the first component 102 are arranged adjacent to one another. In another embodiment, the subparts 102a and 102b are arranged at a distance from one another. The first subpart 102a and the second subpart 102b of the first component 102 represent, by way of example, individual buttons of a switch button arrangement for selecting a gear in a motor vehicle. The second component 104 is arranged separate from the first component 102. The second component 104 may for example be configured as a receiving device or guide device for the first component 102. The first component 102 is movable relative to the second component 104, by way of illustration particularly along a movement axis toward and away from the second component 104. The first subpart 102a and the second subpart 102b of the first component 102 are movable independently of one another relative to the second component 104.

The magnetic field sensor apparatus 101 includes the generator device 101a, the detection device 101b and the evaluating device 114. The generator device 101a is arranged at the first component 102. The detection device 101b is arranged at the second component 104. In the embodiment depicted in FIG. 1, the evaluating device 114 is arranged so as to be separate from the first component 102 and the second component 104. In another embodiment, the evaluating device 114 is integrated, or the like, in the detection device 101b.

In accordance with the embodiment shown in FIG. 1, the generator device 101a has a first magnet 106 with a magnetic north pole N and a magnetic south pole S, and a second magnet 108 with a magnetic north pole N and a magnetic south pole S. The magnets 106 and 108 are, by way of illustration, bar magnets. The first magnet 106 is arranged at the first subpart 102a of the first component 102. In this embodiment, the magnetic north pole N of the first magnet 106 is arranged facing the second component 104 or detection device 101b, and the second magnet 108 is arranged at the second subpart 102b of the first component 102. And, in this embodiment, the magnetic south pole S of the second magnet 108 is arranged facing the second component 104 or detection device 101b. Accordingly, the detection device 101a is formed of two parts.

Continuing with this embodiment, the detection device 101b includes the first sensor 110 and the second sensor 112. The first sensor 110 is arranged in a region of the second component 104 opposite the first subpart 102a. In particular, the first sensor 110 is arranged in a region of the second component 104 opposite the magnetic north pole N of the first sensor 106. The second sensor 112 is arranged in a region of the second component 104 opposite the second subpart 102b. In particular, the second sensor 112 is arranged in a region of the second component 104 opposite the magnetic south pole S of the second sensor 108.

The first magnet 106 is configured to generate or bring about a first magnetic field, and the second magnet 108 is configured to generate or bring about a second magnetic field. The first sensor 110 is configured to generate and supply a first sensor signal which represents a magnetic field detected by the first sensor 110, the detected magnetic field comprising an overlapping of the first magnetic field of the first magnet 106, the second magnetic field of the second magnet 108 and any existing magnetic disturbance field. The second sensor 112 is similarly configured to generate and supply a second sensor signal, represents a magnetic field detected by the second sensor 112, this detected magnetic field comprising an overlapping of the second magnetic field of the second magnet 108, the first magnetic field of the first magnet 106 and any existing magnetic disturbance field.

The evaluating device 114 is configured to read and evaluate the first sensor signal of the first sensor 110 and the second sensor signal of the second sensor 112. To this end, the evaluating device 114 can be connected to the sensors 110, 112 via a communications interface, for example, wirelessly or via electric lines. The evaluating device 114 is configured to combine the first sensor signal with the second sensor signal in order to determine a relative position between the generator device 101a and the detection device 101b and, therefore, a relative position between the first component 102 and the second component 104 or between each subpart 102a and 102b and the second component 104. In particular, the evaluating device 114 is configured to determine the relative position based on at least one parameter of the magnetic fields regardless of a magnitude or direction of any magnetic disturbance field that may be present. The evaluating device 114 can be configured to initially determine a proportion of the magnetic disturbance field and to then take this magnetic disturbance field into account when determining the relative position. Alternatively, the evaluating device 114 can be configured to determine the relative position directly, and the proportion of the magnetic disturbance field eliminated by a suitable combination of first sensor signal and second sensor signal when determining the relative position.

Figure 2:
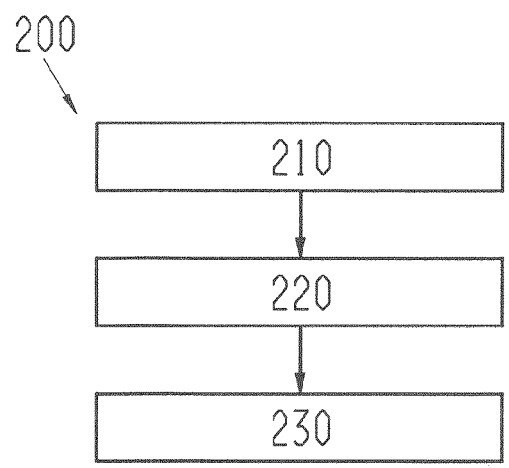
FIG. 2 is a flow diagram of a method for determining a relative position in accordance with an embodiment of the present invention.

FIG. 2 depicts a flow diagram of a method 200 for determining a relative position of the components in accordance with an embodiment of the present invention. More particularly, the relative position between an at least two-part first component and a second component which are arranged so as to be movable relative to one another can be determined by means of the method 200. Thus, by way of example, the relative position between the components of an actuation device as depicted in FIG. 1 can be determined using the method 200.

In a step 210, at least two magnetic fields are generated by means of an at least two-part generator device which has at least two magnets and is arranged at the first component. The magnetic fields can be generated permanently or over a limited period of time, as for example during a measurement cycle.

In a step 220, the magnetic fields are detected by means of a detection device arranged at the second component. The detection device has at least two sensors for generating at least two sensor signals which are dependent on the magnetic fields. The magnets of the generator device are arranged so as to be movable relative to one another and with respect to the detection device. The sensors are arranged adjacent to one another in a detection area in an intersection region of the magnetic fields of the at least two magnets.

In a step 230, the sensor signals are suitably combined by the detection device in order to determine the relative position between the first component and the second component.

Figure 3A:
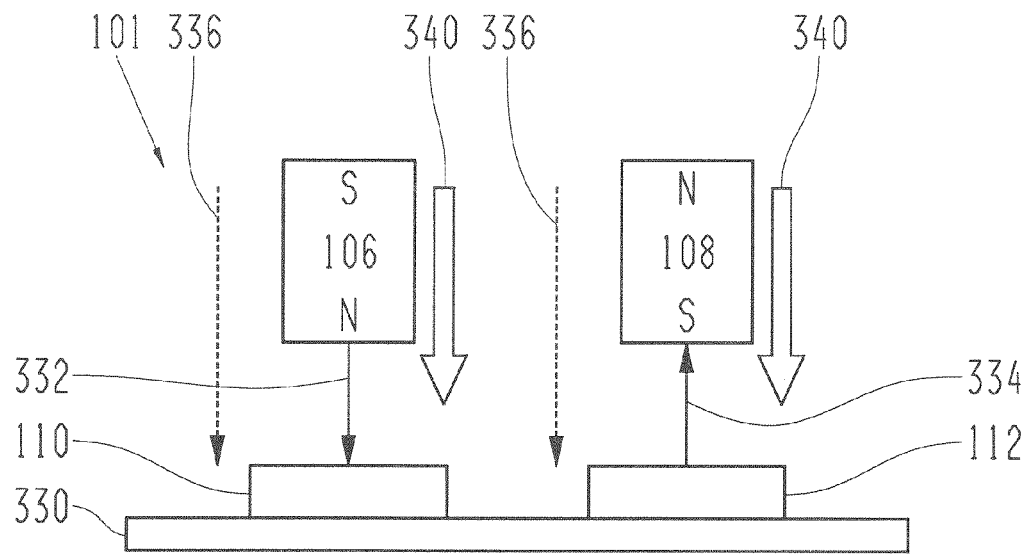
FIGS. 3A and 3B are schematic depictions of a portion of a magnetic field sensor apparatus in accordance with an embodiment of the present invention in different relative positions.

FIG. 3A shows a schematic depiction of a portion of a magnetic field sensor apparatus 101 in accordance with an embodiment of the present invention. The magnetic field sensor apparatus 101 corresponds to, or is similar to, the magnetic field sensor apparatus depicted in and described with reference to FIG. 1. The magnetic field sensor apparatus 101 is part of an actuation device such as the actuation device depicted in and described with reference to FIG. 1. The components of the magnetic field sensor apparatus 101 depicted in FIG. 3A are a first magnet 106, a second magnet 108, a first sensor 110 and a second sensor 112. Also shown in FIG. 3A are a support 330, a first magnetic field 332, a second magnetic field 334, a magnetic disturbance field 336 and a relative movement 340. FIG. 3A depicts the magnetic field sensor apparatus 101 with magnets 106 and 108 in a first relative position with respect to the sensors 110 and 112. This first relative position corresponds to an idle condition of the actuation device having the magnetic field sensor apparatus 101.

Sensors 110 and 112 are arranged at or on the support 330. The support 330 is a circuit board or the like. The sensors 110 and 112 are arranged adjacent to one another and so as to be spaced apart laterally at the support 330. The first magnet 106 is arranged opposite the first sensor 110. A pole of the first magnet 106, in this case the north pole, is oriented opposite a sensing surface of the first sensor 110. The first magnet 106 is configured to generate the first magnetic field 332 which can be detected by the first sensor 110 and by the second sensor 112. The second magnet 108 is arranged opposite the second sensor 112. A pole of the second magnet 108, in this case the south pole, is oriented opposite a sensing surface of the second sensor 112. The second magnet 108 is configured to generate a second magnetic field 334 which can be detected by the second sensor 112 and by the first sensor 110.

The magnetic field detected by the first sensor 110 is dependent on the positions of the first magnet 106 and of the second magnet 108 with respect to the first sensor 110. Accordingly, the first sensor signal generated by the first sensor 110 is dependent on both the first magnetic field 332 and the second magnetic field 334. The magnetic field detected by the second sensor 112 is dependent on the positions of the second magnet 108 and of the first magnet 106 with respect to the second sensor 112. Accordingly, the second sensor signal generated by the second sensor 112 is dependent on both the second magnetic field 334 and the first magnetic field 332.

The sensors 110 and 112 are arranged in a detection area which can be influenced or affected by the magnetic disturbance field 336. The detection area may be selected such that the magnetic disturbance field 336 is virtually homogeneous within the detection area, i.e., the sensors 110 and 112 are influenced by the magnetic disturbance field 336 with substantially identical characteristics. The presence of and the magnitude of such a magnetic disturbance field 336 may be unknown. The first magnetic field 332 and the second magnetic field 334 are depicted in each instance in FIG. 3A by direction vectors [Sx], and the magnetic disturbance field 336 is depicted in FIG. 3A by direction vectors [St]. The first magnetic field 332 is overlapped by the magnetic disturbance field 336, as is the second magnetic field 334. Owing to the different pole orientations of the magnets 106 and 108 with respect to sensors 110 and 112, the first magnetic field 332 is oriented opposite to the second magnetic field 334. The magnetic fields 332, 334 may by way of example be identical in amount or magnitude.

In the first relative position, the first magnet 106 is located at a first distance from the first sensor 110, the second magnet 108 is located at a second distance from the second sensor 112, and the first distance is identical to the second distance within measurement tolerances. Starting from the first relative position shown in FIG. 3A, the first magnet 106 and the second magnet 108 can be displaced individually and independently from one another with respect to the sensors 110 and 112 in the relative movement 340 indicated by a direction arrow in FIG. 3A. In so doing, the first magnet 106 and the second magnet 108 can reach respective second relative positions with respect to the sensors 110 and 112. The relative position of magnets 106 and 108 with respect to sensors 110 and 112 can be inferred from the magnetic fields detected by the sensors 110 and 112.

Figure 3B:
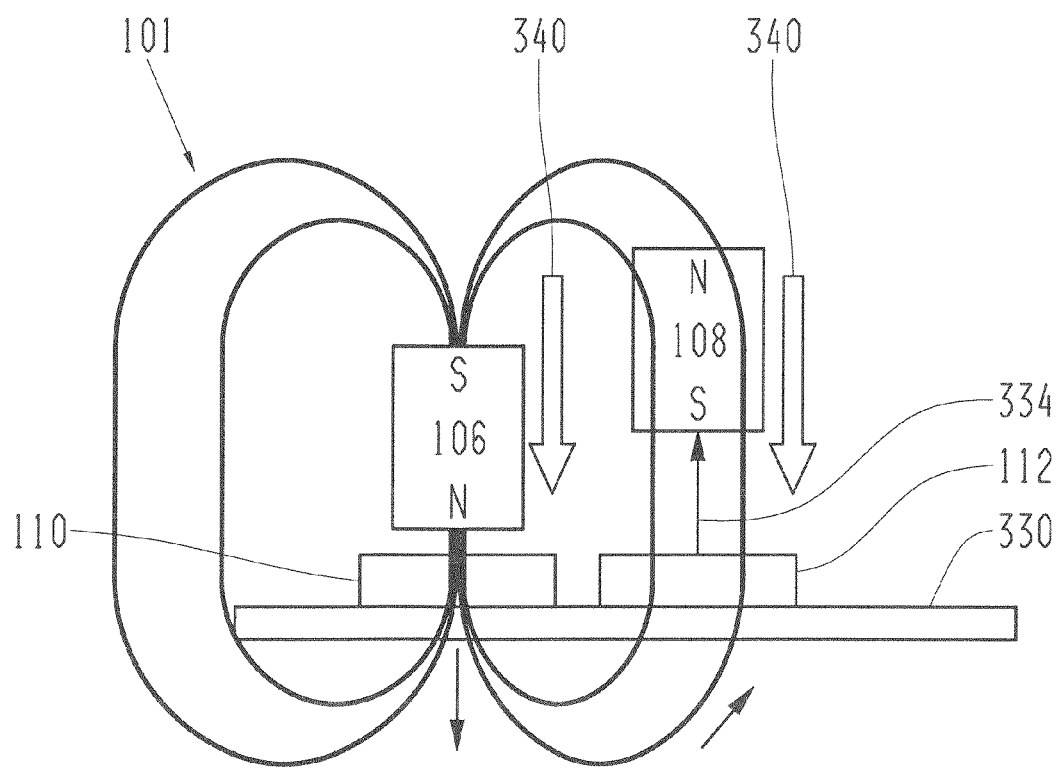

FIG. 3B depicts the magnetic field sensor apparatus 101 of FIG. 3A with the first magnet 106 in its second relative position and the second magnet 108 in its first relative position with respect to sensors 110 and 112. Accordingly, the first magnet 106 is arranged closer to the first sensor 110 than is the second magnet 108 to second sensor 112. Apart from the difference in relative position from that shown in FIG. 3A, FIG. 3B corresponds to FIG. 3A except that magnetic field lines of the first magnetic field of the first magnet 106 are indicated in FIG. 3B by corresponding direction arrows for purposes of illustration, and the disturbance field is not shown. It will be seen that the magnetic field lines of the first magnetic field of the first magnet 106 penetrate both the first sensor 110 and the second sensor 112. The magnetic field lines of the first magnetic field of the first magnet 106 penetrate the first sensor 110 at a first angle and the second sensor 112 at a second angle that is different from the first angle.

An embodiment accommodating the elimination of disturbance signals in an analog Hall sensor system, namely, the magnetic field sensor apparatus 101, will now be described with reference to FIGS. 1 to 3B. In this further embodiment, the sensors 110, 112 can be Hall sensors. A sensor system of this type is sensitive to disturbance from extraneous external magnetic fields or disturbance fields 336 which may be permanent or electrical (transitory) in nature. The sensor system or magnetic field sensor apparatus 101 comprises at least two magnets 106 and 108 and at least two analog sensors 110 and 112. The configuration of the system is chosen such that both sensors 110, 112 are utilized for position detection and can detect the magnitude and direction of relevant disturbance fields 336. Accordingly, the disturbance field 336 can be eliminated by means of a correction calculation. An appropriate correction calculation can be carried out, for example, in the evaluating device 114 diagrammatically depicted in FIG. 1.

In accordance with such an embodiment, the disturbance quantity vector of the disturbance field 336 is determined by way of illustration using the following formula:

$$\left(\frac{\vec{S}_1+\vec{S}_2}{2}\right)=\vec{S}_t,$$

where $\vec{S}_t$: is the disturbance field vector of disturbance field 336, $\vec{S}_1$: is the vector of the magnetic field sensed by the first sensor 110, and $\vec{S}_2$: is the vector of the magnetic field sensed by the second sensor 112.

The position is determined with an adjustment for redundancy and/or plausibility check by the following formula:

$$\vec{S}_1-\vec{S}_t==\vec{S}_2-\vec{S}_t$$

The underlying functional principle is described as follows.

Two identical sensors 110 and 112, as in this example Hall sensors, are positioned relative to two oppositely poled magnets 106 and 108 which can be permanent magnets or electromagnets. The magnets 106 and 108 are movable independently from one another with respect to the sensors 110 and 112. Owing to the opposite orientation of the magnetic fields 332 and 334, the disturbance field 336 can be determined by subtracting the two fields sensed by the sensors 110 and 112. By subtracting the disturbance field 336 from the sensed magnetic field [S1] of the first sensor 110 and from the sensed magnetic field [S2] of the second sensor 112, the relative position can be determined. Subsequently, the relative position is subjected to a plausibility check via the two adjusted sensed values. Accordingly, the two sensors 110 and 112 serve for detecting position and for the plausibility check and are also utilized for determining the disturbance field 336 and adjusting the position detection taking into account the disturbance field 336.

An embodiment of a switch button arrangement for selecting gears of a motor vehicle will now be described with continued reference to FIGS. 1 to 3B. The switch button arrangement comprises, for example, four buttons which have in each instance a separate sensor system comprising a magnet and an analog sensor. When a button is actuated, the magnet moves closer to the sensor so that the magnetic field in the sensor becomes stronger. An unactuated button acts on the sensor with a weak magnetic field.

Two adjacent buttons may by way of example be combined to form a button pair, e.g., P/R for park and reverse or N/D for neutral (or idle) and drive, and the sensor positions of a button pair are as close together as possible. Each button pair represents an actuation device 100 such as depicted in FIG. 1 and comprises a magnetic field sensor apparatus 101 in accord with FIGS. 1, 3A and 3B. The buttons of a pair represent the first component 102 of the actuation device 100.

The two permanent magnets 106 and 108 within a button pair are opposed, i.e., a button P has the first magnet 106 with the north pole facing the first sensor 110, and a button R has the second magnet 108 with the south pole facing the second sensor 112. To determine a disturbance field 336, the sensor results of a button pair are calculated together. The useful signal cancels out with the disturbance component as a remainder. Accordingly, the useful component can be determined from the sensor signals of sensors 110 and 112. A plausibility check can be extended and improved via the pair, i.e., as was described above, a disturbance signal is determined for pair P/R ($S_{PR}$) and another disturbance signal is determined for pair N/D ($S_{ND}$). The two disturbance signals $S_{PR}$ and $S_{ND}$ can then be compared and subjected to a plausibility check.

The embodiments described above and illustrated in the drawings are intended to serve only as examples. Different embodiments can be combined with one another in their entirety or with respect to individual features. An embodiment can also be supplemented by features of another embodiment. Method steps of the invention can, moreover, be repeated or carried out in a sequence other than that described.

The invention claimed is:

1. A magnetic field sensor apparatus, comprising:
 a generator device comprising a first part and a second part, and a first magnet for generating a first magnetic field and a second magnet for generating a second magnetic field; and
 a detection device for detecting the first and second generated magnetic fields;
 wherein the first and second magnets are arranged for movement relative to one another and relative to the detection device;
 wherein the detection device comprises first and second sensors each operable for generating respective first and second sensor signals in dependent response to sensing of at least one of the first and second generated magnetic fields; and
 wherein the first and second sensors are arranged adjacent to one another in a detection area that comprises an intersection region of the generated first and second magnetic fields of the first and second magnets.

2. The magnetic field sensor apparatus in accordance with claim 1, further comprising an evaluating device configured to combine the first and second sensor signals of the detection device and operable for determining one of (i) a magnetic disturbance quantity superposed on the generated first and second magnetic fields, a parameter of the first and second magnetic fields and (iii) a relative position between the generator device and the detection device.

3. The magnetic field sensor apparatus in accordance with claim 1, wherein the first magnet of the generator device is associated with the first part and the second magnet of the generator device is associated with the second part, and wherein the first part and the second part of the generator device are arranged for movement relative to one another for respectively moving the first magnet and the second magnet relative to each other and relative to the detection device.

4. The magnetic field sensor apparatus in accordance with claim 3, wherein the first magnet and the second magnet are arranged with opposite pole orientations relative to one another such that the generated first and second magnetic fields are oriented in opposite directions to one another.

5. The magnetic field sensor apparatus in accordance with claim 3, wherein the first sensor is configured for generating the first sensor signal in dependent response to sensing of the first and second magnetic fields, and the second sensor is configured for generating the second sensor signal in dependent response to sensing of the first and second magnetic fields, and wherein a sensing direction of the first sensor corresponds to a sensing direction of the second sensor.

6. The magnetic field sensor apparatus in accordance with claim 5, wherein magnetic field lines of the first generated magnetic field and of the second generated magnetic field penetrate the first sensor and the second sensor during operation of the magnetic field sensor apparatus.

7. The magnetic field sensor apparatus in accordance with claim 1, wherein the first and second sensors are arranged adjacent to one another and are arranged one of a in sensing plane and on a common support substrate.

8. An actuation device for a vehicle, comprising:
a first component comprising a first part and a second part;
a second component;
wherein the first and second components are arranged for movement relative to one another; and
a magnetic field sensor apparatus comprising:
   a generator device comprising a first part and a second part, and a first magnet for generating a first magnetic field and a second magnet for generating a second magnetic field; and
   a detection device for detecting the first and second generated magnetic fields;
   wherein the first and second magnets are arranged for movement relative to one another and relative to the detection device;
   wherein the detection device comprises first and second sensors each operable for generating respective first and second sensor signals in dependent response to sensing of at least one of the first and second generated magnetic fields; and
   wherein the first and second sensors are arranged adjacent to one another in a detection area that comprises an intersection region of the generated first and second magnetic fields of the first and second magnets;
   wherein the generator device is arranged at the first component and the detection device is arranged at the second component.

9. A method for determining a relative position between a first component comprising at least two parts and a second component, wherein the first and second components are arranged for movement relative to one another, the method comprising:
generating at least two magnetic fields with a generator device that comprises at least two parts, is arranged at the first component and includes at least two magnets each for generating a respective magnetic field;
detecting the generated magnetic fields with a detection device that is arranged at the second component and includes at least two sensors each for generating a respective sensor signal in dependence on the generated magnetic fields, the at least two sensors being arranged adjacent to one another in a detection area that comprises an intersection region of the magnetic fields generated by the at least two magnets; and
combining the sensor signals generated by the at least two sensors to determine the relative position between the first component and the second component.

* * * * *